(12) United States Patent
Kuo et al.

(10) Patent No.: US 10,163,720 B2
(45) Date of Patent: Dec. 25, 2018

(54) METHOD OF FORMING SOURCE/DRAIN CONTACT

(71) Applicant: Taiwan Semiconductor Manufacturing Company, Ltd., Hsinchu (TW)

(72) Inventors: Ming-Jhih Kuo, Hsinchu County (TW); Yu-Hsien Lin, Hsinchu (TW); Hung-Chang Hsieh, Hsinchu (TW); Jhun Hua Chen, Changhua County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/790,975

(22) Filed: Oct. 23, 2017

(65) Prior Publication Data
US 2018/0061715 A1 Mar. 1, 2018

Related U.S. Application Data

(62) Division of application No. 14/521,965, filed on Oct. 23, 2014, now Pat. No. 9,799,567.

(51) Int. Cl.
*H01L 21/8234* (2006.01)
*H01L 21/768* (2006.01)
(Continued)

(52) U.S. Cl.
CPC .......... *H01L 21/823475* (2013.01); *H01L 21/76829* (2013.01); *H01L 21/76895* (2013.01);
(Continued)

(58) Field of Classification Search
CPC ..... H01L 21/823468; H01L 21/823864; H01L 21/02063; H01L 21/76877;
(Continued)

(56) References Cited

U.S. PATENT DOCUMENTS 6,380,042 B1    4/2002  Huang
2012/0267727 A1  10/2012  Ho et al.
(Continued)

FOREIGN PATENT DOCUMENTS

JP    2000353795 A    12/2000
JP    2011191623 A    9/2011
(Continued)

*Primary Examiner* — David Spalla
(74) *Attorney, Agent, or Firm* — Haynes and Boone, LLP

(57) ABSTRACT

Methods for fabricating semiconductor devices are disclosed. An exemplary method includes forming first spacers along sidewalls of a gate structure that is disposed over a substrate and between source/drain features. A first dielectric layer is formed over the substrate and recessed to expose upper portions of the first spacers. A spacer layer is then formed over the upper portions of the first spacers. A second dielectric layer is formed over the spacer layer, and a patterned masking layer is formed over the second dielectric layer. The second dielectric layer, the spacer layer, and the first dielectric layer are patterned. For example, exposed portions of the second dielectric layer, the spacer layer (forming second spacers disposed along the upper portions of the first spacers), and the first dielectric layer are etched to form a trench exposing the gate structure and the source/drain features. The trench is filled with a conductive material.

20 Claims, 16 Drawing Sheets

(51) Int. Cl.
   *H01L 29/66* (2006.01)
   *H01L 27/088* (2006.01)
   *H01L 29/165* (2006.01)
   *H01L 29/51* (2006.01)

(52) U.S. Cl.
   CPC .............. *H01L 21/76897* (2013.01); *H01L 21/823468* (2013.01); *H01L 29/6656* (2013.01); *H01L 29/66636* (2013.01); *H01L 27/088* (2013.01); *H01L 29/165* (2013.01); *H01L 29/517* (2013.01)

(58) Field of Classification Search
   CPC ......... H01L 21/76897; H01L 21/76802; H01L 21/76804; H01L 21/76843; H01L 29/6656; H01L 2221/101
   See application file for complete search history.

(56) References Cited

U.S. PATENT DOCUMENTS

2013/0119474 A1   5/2013   Schultz
2016/0020140 A1   1/2016   Ryan

FOREIGN PATENT DOCUMENTS

| KR | 20010077992 A | 8/2001 |
|----|---------------|--------|
| KR | 20040059484 A | 7/2004 |
| TW | 441012 B      | 6/2001 |
| TW | 485554        | 5/2002 |
| TW | 201347005 A   | 11/2013 |

METHOD OF FORMING SOURCE/DRAIN CONTACT

This is a divisional patent application of U.S. patent application Ser. No. 14/521,965, filed Oct. 23, 2014, now U.S. Pat. No. 9,799,567, which is herein incorporated by reference in its entirety.

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. One area is the wiring, or interconnects, between the transistors and other devices. Although existing methods of fabricating IC devices have been generally adequate for their intended purposes, they have not been entirely satisfactory in all respects. For example, challenges rise to develop robust interconnection processes and structures.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

Figure 1:
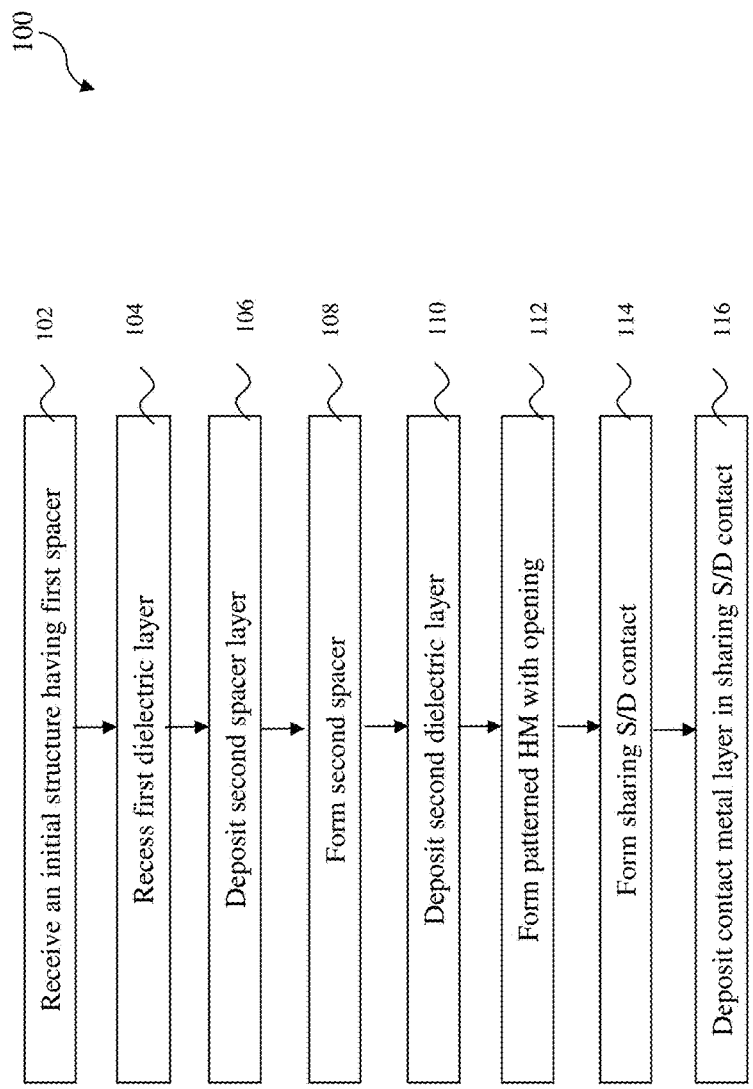
FIG. 1 is a flowchart of an example method for fabricating a semiconductor device constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more semiconductor devices in accordance with some embodiments. The method 100 is discussed in detail below, with reference to a semiconductor device 200, shown in FIGS. 2-9.

Figure 2:
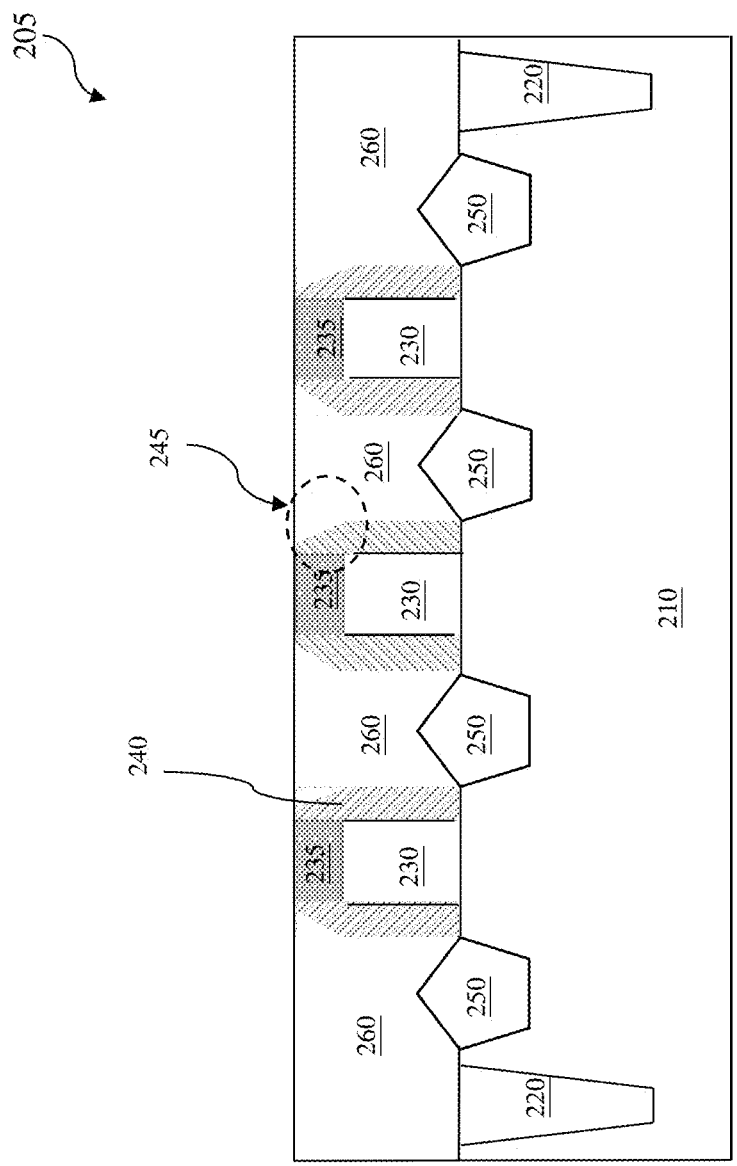
FIGS. 2 to 9 are cross-sectional views of an example semiconductor device in accordance with some embodiments.

Referring to FIGS. 1 and 2, the method 100 starts at step 102 by receiving an initial structure 205 of the semiconductor device 200. The initial structure 205 includes a substrate 210. Substrate 210 may be a bulk silicon substrate. Alternatively, the substrate 210 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary semiconductor device 200, the insulator layer is a component (e.g., layer) of a silicon-on-insulator substrate.

The substrate 210 may also include various doped regions. The doped regions may be doped with p-type dopants, such as boron or $BF_2$; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide-semiconductor transistor device.

The substrate 210 may also include various isolation features 220. The isolation features 220 separate various device regions in the substrate 210. The isolation features 220 include different structures formed by using different processing technologies. For example, the isolation features 220 may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features 220.

The initial structure 205 also includes a plurality of gate structures 230 over the substrate 210. In the present embodiment, the gate structure 230 includes high-k/metal gates (HK/MGs). As an example, the HK/MGs may include a gate dielectric layer and metal gate (MG). The gate dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The MG may include a single layer or multi layers, such as a metal layer, a liner layer, a wetting layer, and an adhesion layer. The MG may include Ti, Ag, Al, TiAlN, TaC, TaCN, TaSiN, Mn, Zr, TiN, TaN, Ru, Mo, Al, WN, Cu, W, or any suitable materials. The gate dielectric layers may be deposited by a suitable method, such as chemical vapor deposition (CVD), atomic layer deposition (ALD), thermal oxidation or ozone oxidation, other suitable technique, or a combination thereof. The MG may be formed by ALD, physical vapor deposition (PVD), CVD, or other suitable process.

In some embodiment, dummy gate stacks are formed first and then are replaced later by HK/MGs 230 after high thermal temperature processes are performed, such as thermal processes during sources/drains formation. The dummy gate stack may include a dummy gate dielectric layer and a polysilicon layer and may be formed by deposition, patterning and etching processes.

A first hard mask 235, or first hard mask, may be formed on top of each of the HK/MGs 230. The first hard mask 235 may include titanium oxide, tantalum oxide, silicon nitride, silicon oxide, silicon carbide, silicon carbide nitride, or other suitable material. The first hard mask 235 be formed by deposition, lithography patterning and etch processes.

Sidewall spacers 240 are formed along the sidewalls of the HK/MGs 230. The sidewall spacers 240 may include a dielectric material such as silicon oxide. Alternatively, the sidewall spacers 240 may include silicon nitride, silicon carbide, silicon oxynitride, or combinations thereof. The sidewall spacers 240 may be formed by depositing a gate sidewall spacer layer and then anisotropic dry etching the gate sidewall spacer layer, known in the art.

In some embodiments a width of the sidewall spacer 240 is not uniform. Here, the sidewall spacer 240 has an outer edge at its upper portion facing away from the HK/MG 230, referred to as a thinner shoulder 245. The thinner shoulder 245 may be a result of an extensive loss (such as caused by a faster etch rate) at the top portion during the gate sidewall spacer formation. The thinner shoulder 245 may result lead to weaker protection for the HK/MG 230 in a subsequent etch process, As will be described below, the present disclosure provides a method for enhancing the protection of the HK/MG 230 in a subsequent etch process having such a thinner shoulder 245.

The initial structure 205 also includes source/drain (S/D) features 250 over the substrate 210, beside the HK/MG 230. In some embodiments, the source/drain feature 250 is a source feature, and another source/drain feature 250 is a drain feature. The source/drain features 250 are separated by the HK/MG 230. In one embodiment, a portion of the substrate 210, beside the HK/MG 230 is recessed to form S/D recesses and then the S/D features 250 are formed over the S/D recesses by epitaxial growing processes, such as CVD, VPE and/or UHV-CVD, molecular beam epitaxy, and/or other suitable processes.

The S/D features 250 may include germanium (Ge), silicon (Si), gallium arsenide (GaAs), aluminum gallium arsenide (AlGaAs), silicon germanium (SiGe), gallium arsenide phosphide (GaAsP), gallium antimony (GaSb), indium antimony (InSb), indium gallium arsenide (InGaAs), indium arsenide (InAs), or other suitable materials. The S/D features 250 may be formed by epitaxial growing processes, such as CVD deposition techniques (e.g., vapor-phase epitaxy (VPE) and/or ultra-high vacuum CVD (UHV-CVD)), molecular beam epitaxy, and/or other suitable processes. After the S/D recesses are filled with the S/D feature 250, further epitaxial growth of a top layer of the S/D features 250 expands horizontally and facets may start to form, such as a diamond shape facets. The S/D features 250 may be in-situ doped during the epi processes. For example, in one embodiment, the S/D feature 250 includes an epitaxially grown SiGe layer that is doped with boron. In another embodiment, the S/D feature 250 includes an epitaxially grown Si epi layer that is doped with carbon. In yet another embodiment, the S/D feature 250 includes an epitaxially grown Si epi layer that is doped with phosphorous. In one embodiment, the S/D feature 250 is not in-situ doped, an implantation process (i.e., a junction implant process) is performed to dope the S/D feature 250. One or more annealing processes may be performed to activate dopants. The annealing processes comprise rapid thermal annealing (RTA) and/or laser annealing processes.

The initial structure 205 also includes a first dielectric layer 260 deposited over the substrate 210, including between/over each of the first conductive features 230 and over the S/D features 250. The first dielectric layer 260 may be deposited by CVD, ALD or spin-on coating. The first dielectric layer 260 includes silicon oxide, silicon nitride, oxynitride, a dielectric material having a dielectric constant (k) lower than thermal silicon oxide (therefore referred to as low-k dielectric material layer), and/or other suitable dielectric material layer. The first dielectric layer 260 may include a single layer or multiple layers. In the present embodiment, the first dielectric layer 260 is different from the sidewall spacer 240 and the first hard mask 235 to achieve etching selectivity during a subsequent etch as described in more detail below. For example, in one embodiment, the first dielectric layer 260 includes silicon oxide while both of the sidewall spacer 240 and the first hard mask 235 include silicon nitride.

Figure 3:
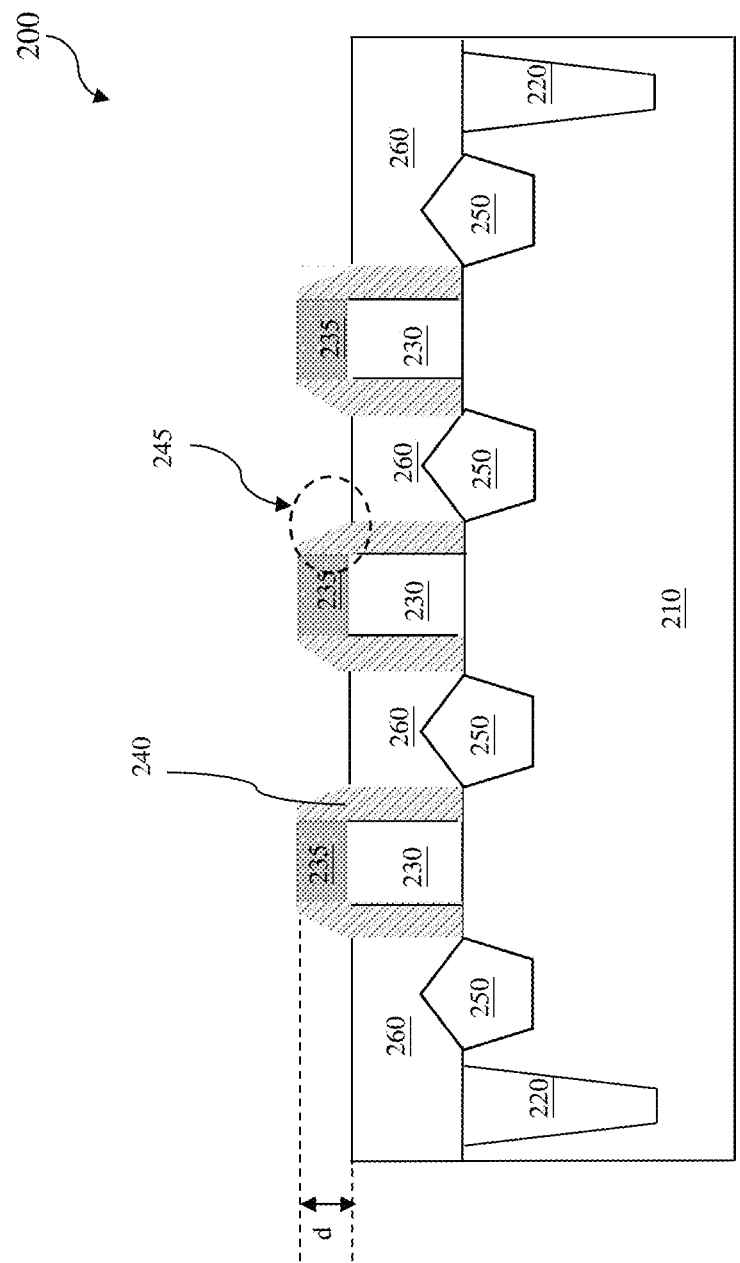

Referring to FIGS. 1 and 3, once the initial structure 205 is received, the method of 100 proceeds to step 104 by recessing the first dielectric layer 260 to expose an upper portion of the sidewall spacer 240. As has been mentioned previously, the recessing process is properly chosen to selectively etch the first dielectric layers 260, but substantially does not etch the first hard mask 235 and the sidewall spacer 240. The selective etch may include a selective wet etch, a selective dry etch, and/or a combination thereof. Alternatively, the first dielectric layer 260 is recessed by lithography patterning and etching processes. A depth d of the recessing process is controlled to achieve a target height of a second spacer to be formed, which will be described later. Here, the first dielectric layer 260 is recessed such that the thinner shoulder 245 is fully exposed.

Figure 4:
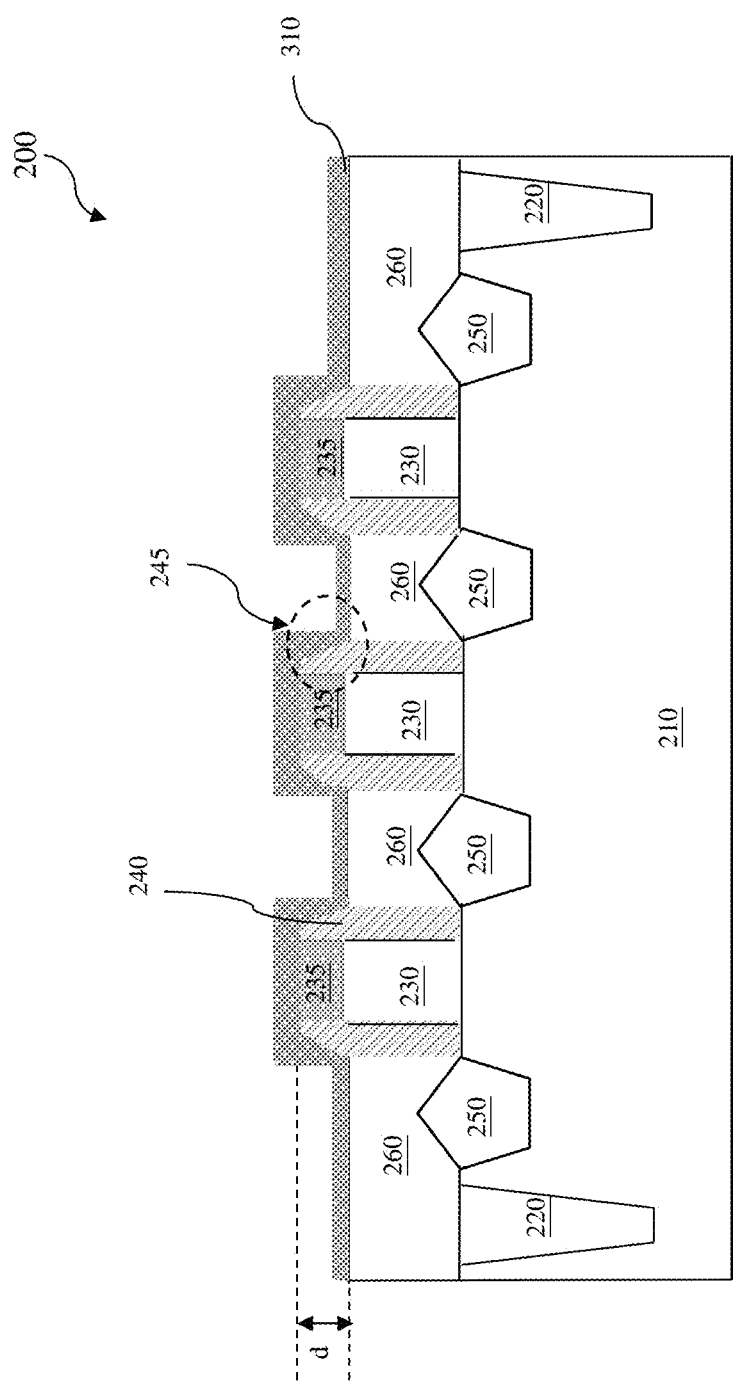

Referring to FIGS. 1 and 4, the method 100 proceeds to step 106 by depositing a second spacer layer 310 over the substrate, including over the outer edge of the sidewall spacers 240 and the first hard mask 235 and over the first dielectric layer 260. In the present embodiment, the second spacer layer 310 covers the thinner shoulder 245. The second spacer layer 310 may include titanium oxide, tantalum oxide, titanium nitride, silicon nitride, silicon oxide, silicon carbide, silicon carbide nitride, and/or other suitable material. The second spacer layer 310 may be deposited by any suitable techniques, such as CVD, PVD and ALD. In the present embodiment, the second spacer layer 310 is different from the first dielectric layer 260 to achieve etching selectivity during a subsequent etch as will be described in further detail below. For example, the second spacer layer 310 includes silicon nitride while the first dielectric layer 260 includes silicon oxide.

Figure 5:
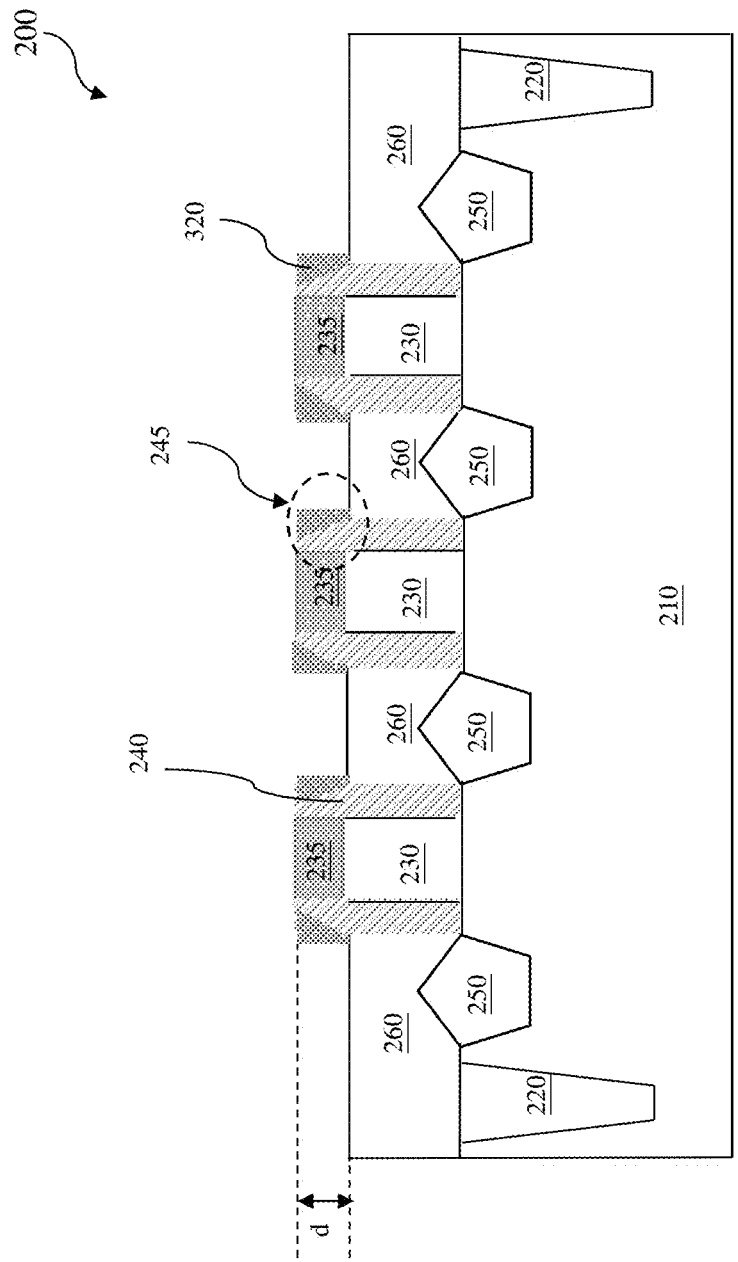

Referring to FIGS. 1 and 5, the method 100 proceeds to step 108 by etching the second spacer layer 310 to form second spacer 320 along the outer edge of the sidewall spacer 240. In one embodiment, the second spacer 320 is formed by anisotropic etching the second spacer layer 310 except the second spacer layer 310 along the sidewall of the sidewall spacer 240. The anisotropic etching may include a dry etch process. Thus, in the present embodiment, the second spacer 320 physically contacts and is disposed along the upper portion of the sidewall spacer 240 with a height, which is same as the distance d. With the second spacer 320, a total width of the thinner shoulder 245 increases to an adequate width for subsequent etching processes, which will be described later.

Figure 6:
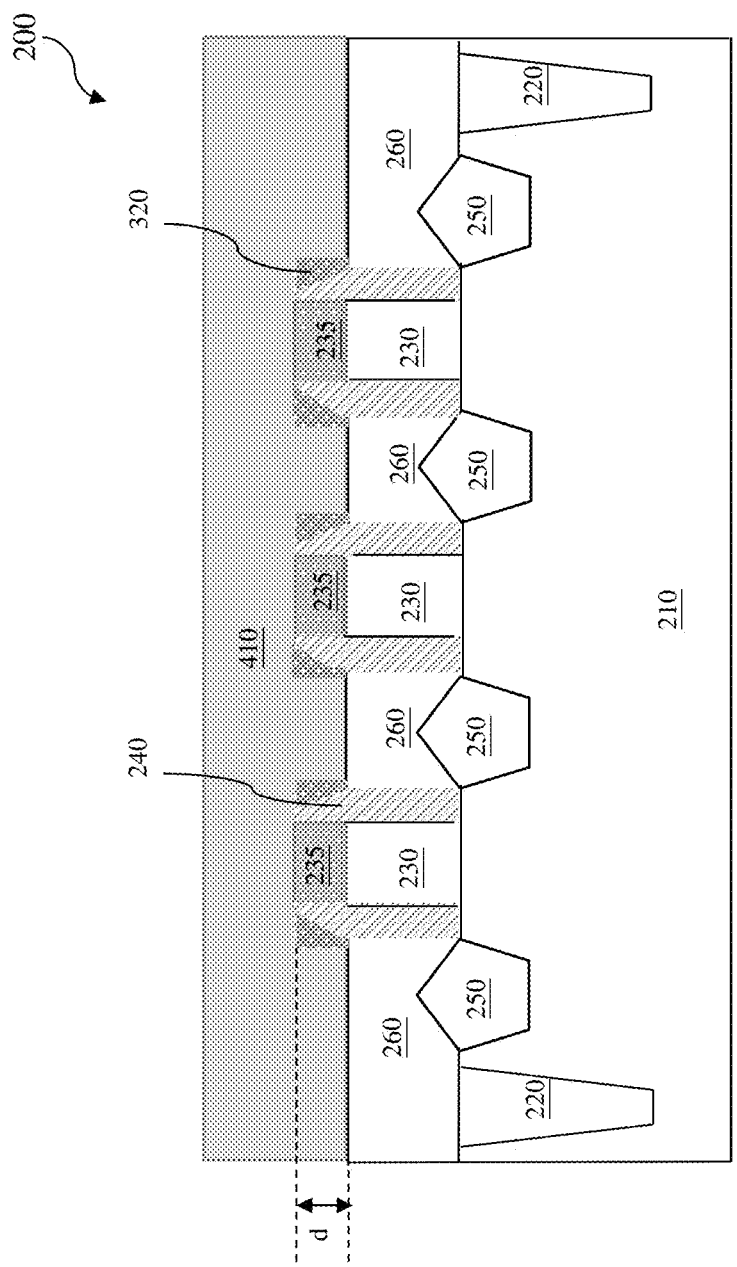

Referring to FIGS. 1 and 6, the method 100 proceeds to step 110 by depositing a second dielectric layer 410 over the first dielectric layer 260. The second dielectric layer 410 is similar in many respects to the first dielectric layer 260 discussed above in association with FIG. 2. In the present embodiments, the second dielectric layer 410 is different from the first hard mask layer 235, the sidewall spacer 240 and the second spacer 320 to achieve etching selectivity during a subsequent etch as described below in more detail.

Figure 7:
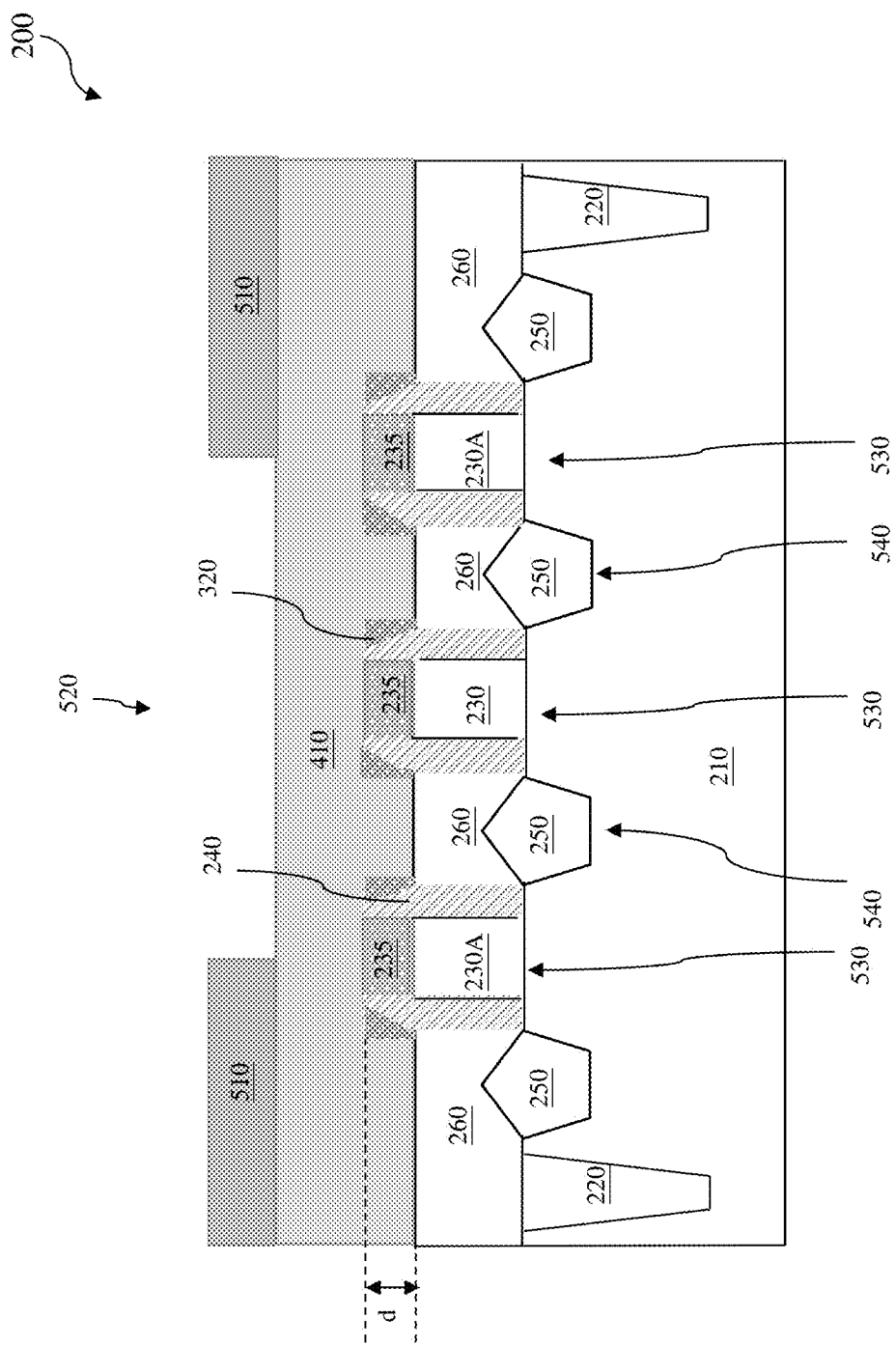

Referring to FIGS. 1 and 7, the method 100 proceeds to step 112 by forming a patterned second hard mask (HM) layer 510 with an opening 520 over the second dielectric layer 410. In the present embodiment, a subset 530 of HK/MGs 230 and a subset 540 of the S/D features 250 are within the opening 520. The subset 530 of HK/MGs 230 includes one or more whole HK/MGs 230 and may also include one or more partial HK/MGs 230, referred to as HK/MG 230A, as shown in FIG. 7. In one embodiment, the patterned second HM layer 510 is a patterned photoresist layer. In another embodiment, the patterned second HM layer 510 is formed by depositing a sub-HM layer over the second dielectric layer 410, depositing photoresist layer over the sub-HM layer, patterning the photoresist layer and then etching the sub-HM layer through patterned photoresist layer.

Figure 8:
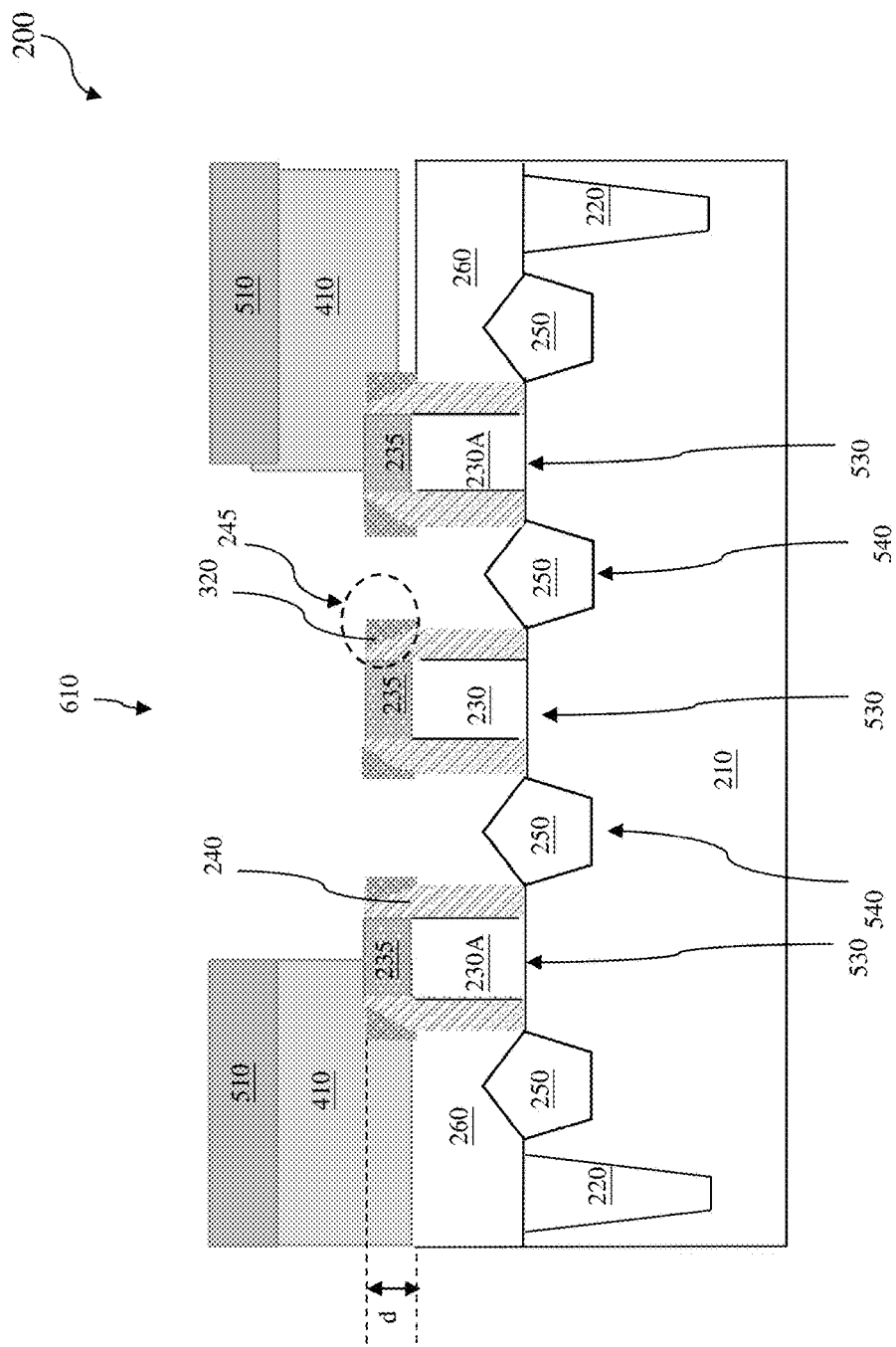

Referring to FIGS. 1 and 8 the method 100 proceeds to step 114 by etching the second and first dielectric layers, 410 and 260, through the opening 520 to form a sharing S/D contact trench 610. In the present embodiment, the subset 540 of the S/D features 250 is exposed in the sharing S/D contact trench 610. As has been mentioned previously, the etch process is properly chosen to selectively remove the second and the first dielectric layers, 410 and 260, but substantially does not etch the first hard mask 235, the second spacer 320 and the sidewall spacer 240. The selective etch may include a selective wet etch, a selective dry etch, and/or a combination thereof. The patterned second HM layer 510 is removed by an etching process thereafter.

Accordingly, the second spacer 320 serves as an etch stopper and enhances protection for the subset 530 of the HK/MG 230 during the etch process. For example, without second spacer 320, the thinner shoulder 245 could be further etched away during forming the sharing S/D contact trench 610, thereby exposing a portion of the metal gate of HK/MG 230 and leading to shorting issues when forming a contact feature over S/D features 250. Here, second spacer 320 prevents subsequent etching of the thinner shoulder 245 thereby preventing exposure of the HK/MG 230 during etch process and subsequent shorting issues that follow therefrom. Also with etch selectivity, the sharing S/D contact trench 610 is formed with a self-alignment nature, which relaxes lithography process constrains and etching process constrains and improves process window.

Figure 9:
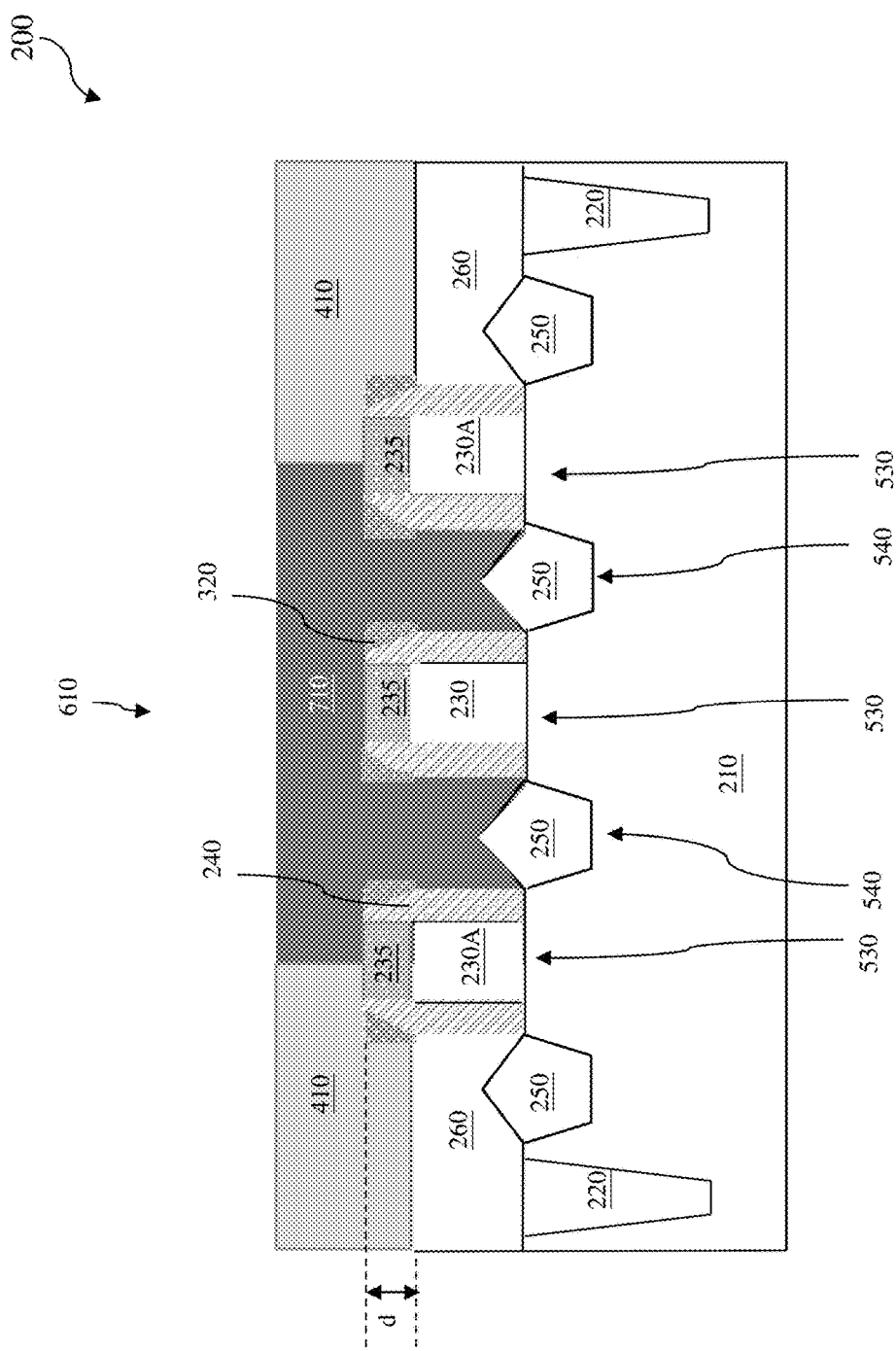

Referring to FIGS. 1 and 9, the method 100 proceeds to step 116 by depositing a contact metal layer 710 in the sharing S/D contact trench 610 to form full contact features extending down to the subset 540 of the S/D features 250. In the present embodiment, the subset 530 of the HK/MGs 230 are isolated from the contact metal layer 710 by being surrounded by the first hard mask 235, the second spacer 320 and the sidewall spacer 240. The contact metal layer 710 may include copper (Cu), aluminum (Al), tungsten (W), copper or copper alloy, such as copper magnesium (CuMn), copper aluminum (CuAl) or copper silicon (CuSi), or other suitable conductive material. The contact metal layer 710 may be deposited by PVD, CVD, metal-organic chemical vapor deposition (MOCVD), or plating. Additionally, a CMP is performed to etch back the excessive contact metal layer 710 to provide a substantially planar surface.

Additional steps can be provided before, during, and after the method 100, and some of the steps described can be replaced, eliminated, or moved around for additional embodiments of the method 100.

Figure 10:
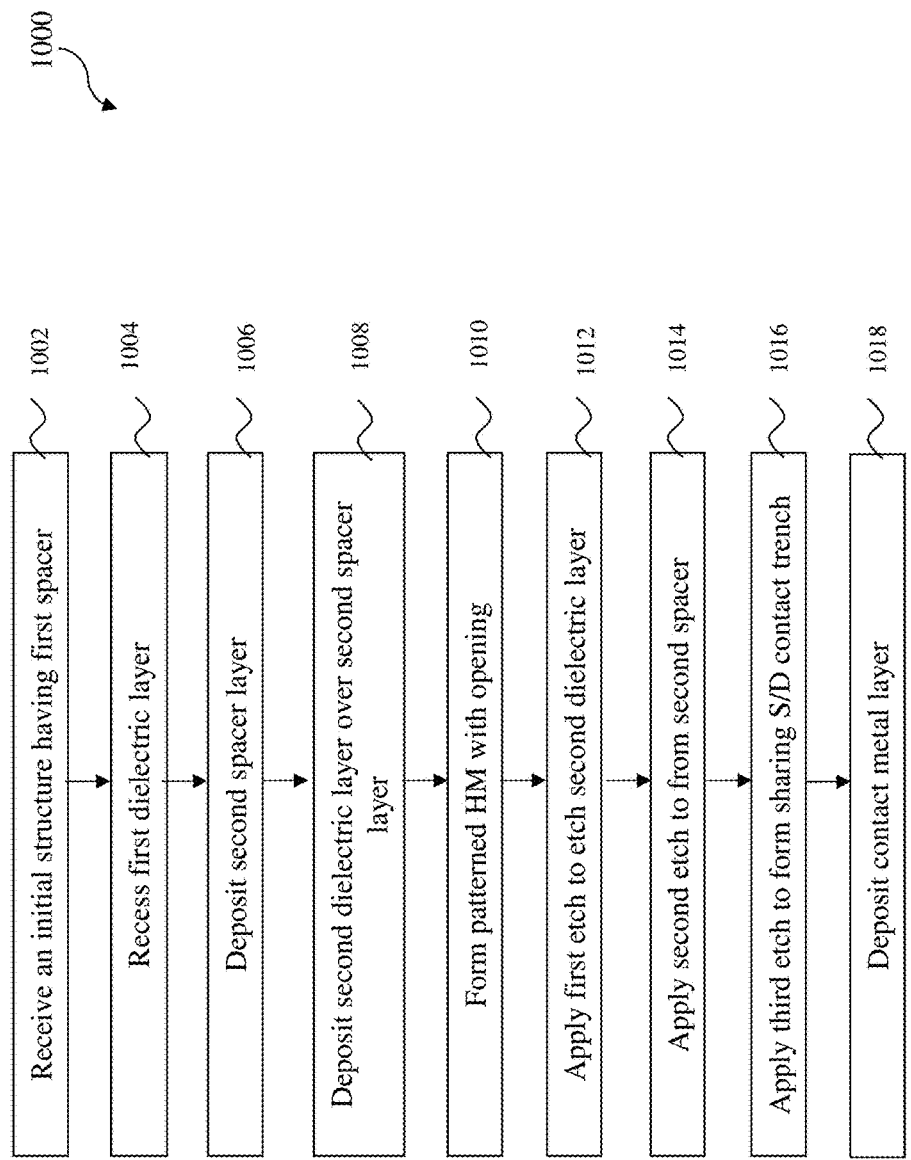
FIG. 10 is a flow chart of an example method for fabricating a semiconductor device in accordance with some embodiments.

FIG. 10 is a flowchart of another example method 1000 for fabricating a semiconductor device 2000. The first three steps of the method 1000, 1002, 1004, 1006, are similar to those discussed above in steps 102, 104 and 106, respectively, of the method 100. Thus, the discussion above with respect to steps 102, 104 and 106, is applicable to the steps 1002, 1004 and 1006, respectively. The present disclosure repeats reference numerals and/or letters in the various embodiments. This repetition is for the purpose of simplicity and clarity such that repeated reference numerals and/or letters indicate similar features amongst the various embodiments unless stated otherwise.

Figure 11:
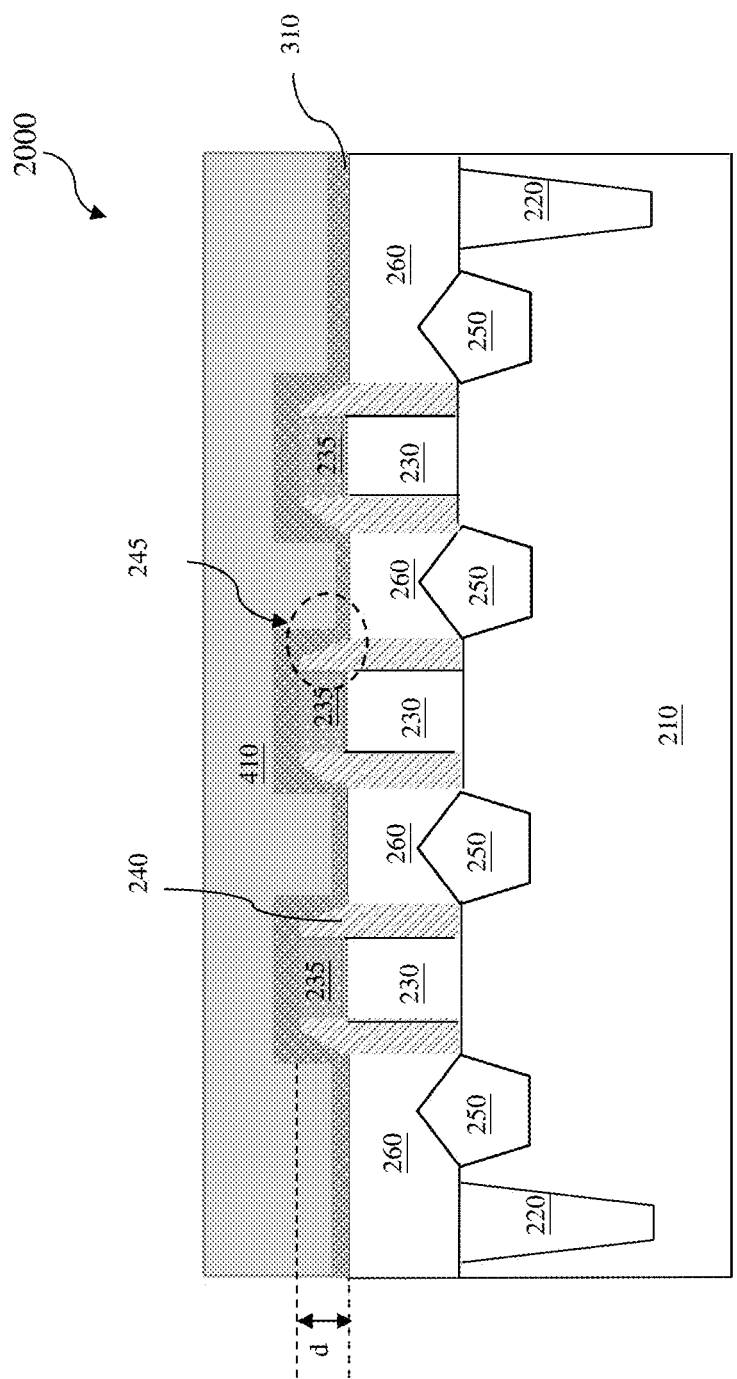
FIGS. 11 to 16 are cross-sectional views of an example semiconductor device in accordance with some embodiments.

Referring to FIGS. 10 and 11, the method 1000 proceeds to step 1008 by depositing the second dielectric layer 410 over the second spacer layer 310. The deposition is similarly in many respects to depositing the second dielectric layer 410 over the first dielectric layer 260 discussed above in association with FIG. 6.

Figure 12:
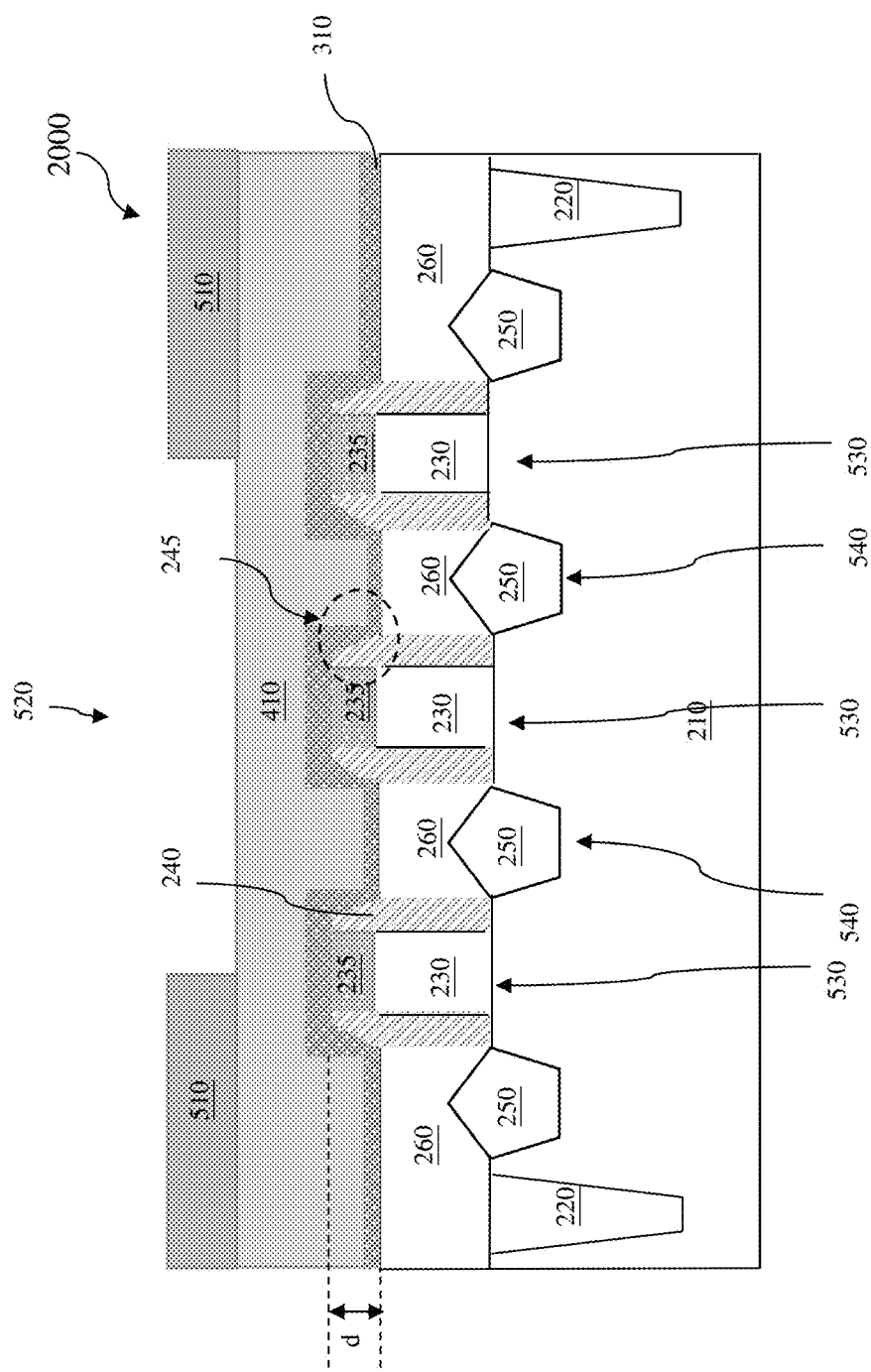

Referring to FIGS. 10 and 12, the method 1000 proceeds to step 1010 by forming the patterned second HM layer 510 with the opening 520 over the second dielectric layer 410. In the present embodiment, the subset 530 of HK/MG gate 230 and the subset 540 of the S/D features 250 are within the opening 520. The subset 530 of HK/MGs 230 includes one or more whole HK/MGs 230 and may also include one or more partial HK/MGs 230A.

Figure 13:
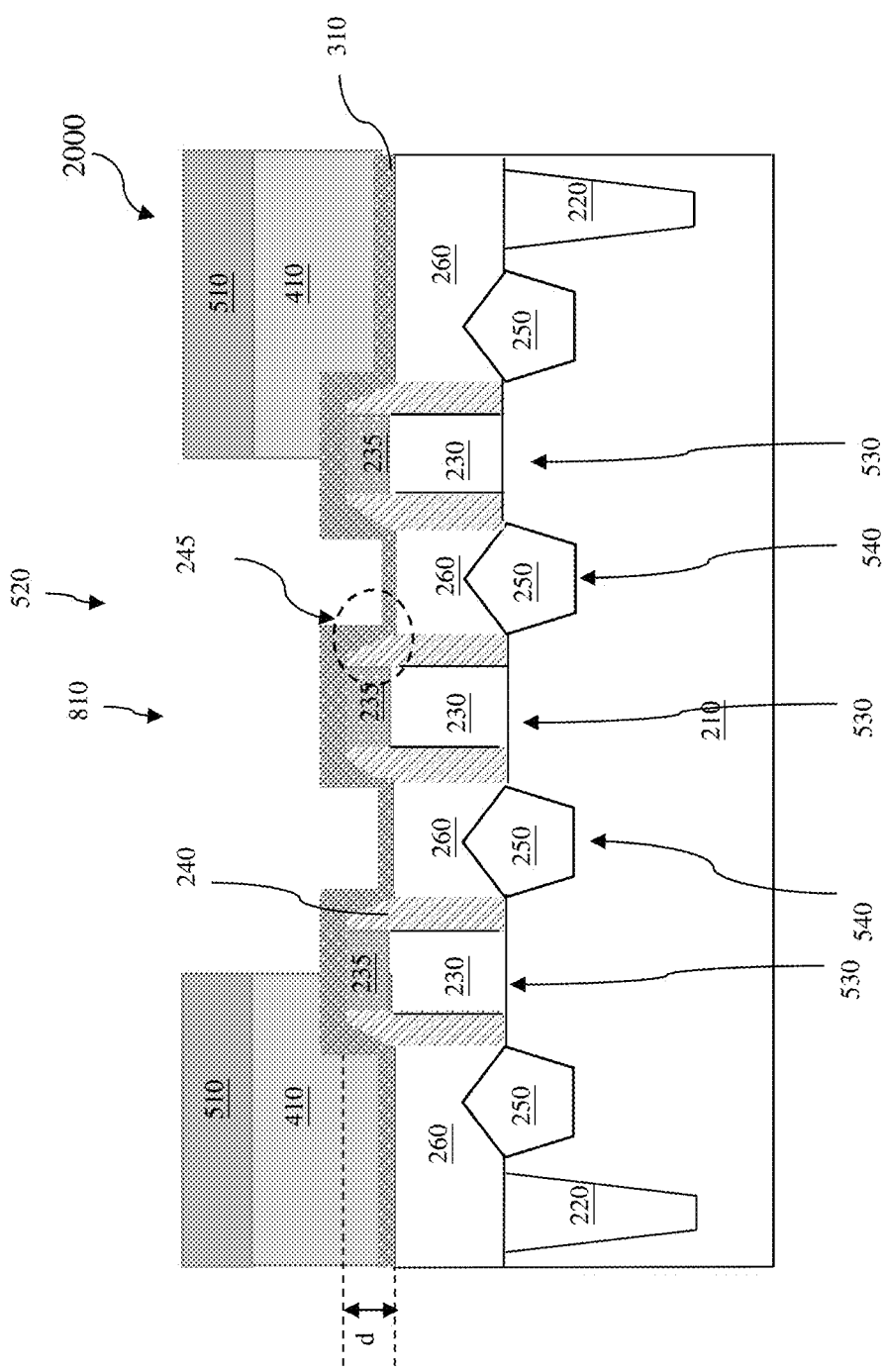

Referring to FIGS. 10 and 13, the method 1000 proceeds to step 1012 by applying a first etching process to etch the second dielectric layer 410 through the opening 520 to form a S/D sharing contact trench 810. As has been mentioned previously, the etch process is properly chosen to selectively remove the second dielectric layers 410, but substantially does not etch the second spacer layer 310. The selective etch may include a selective wet etch, a selective dry etch, and/or a combination thereof. Thus the second spacer layer 310 serves as an etch stopper and enhances protection for the subset 530 of the HK/MG 230 during the etch process, especially at the thinner shoulder 245. The second spacer layer 310 is exposed within the first sharing S/D contact trench 810.

Figure 14:
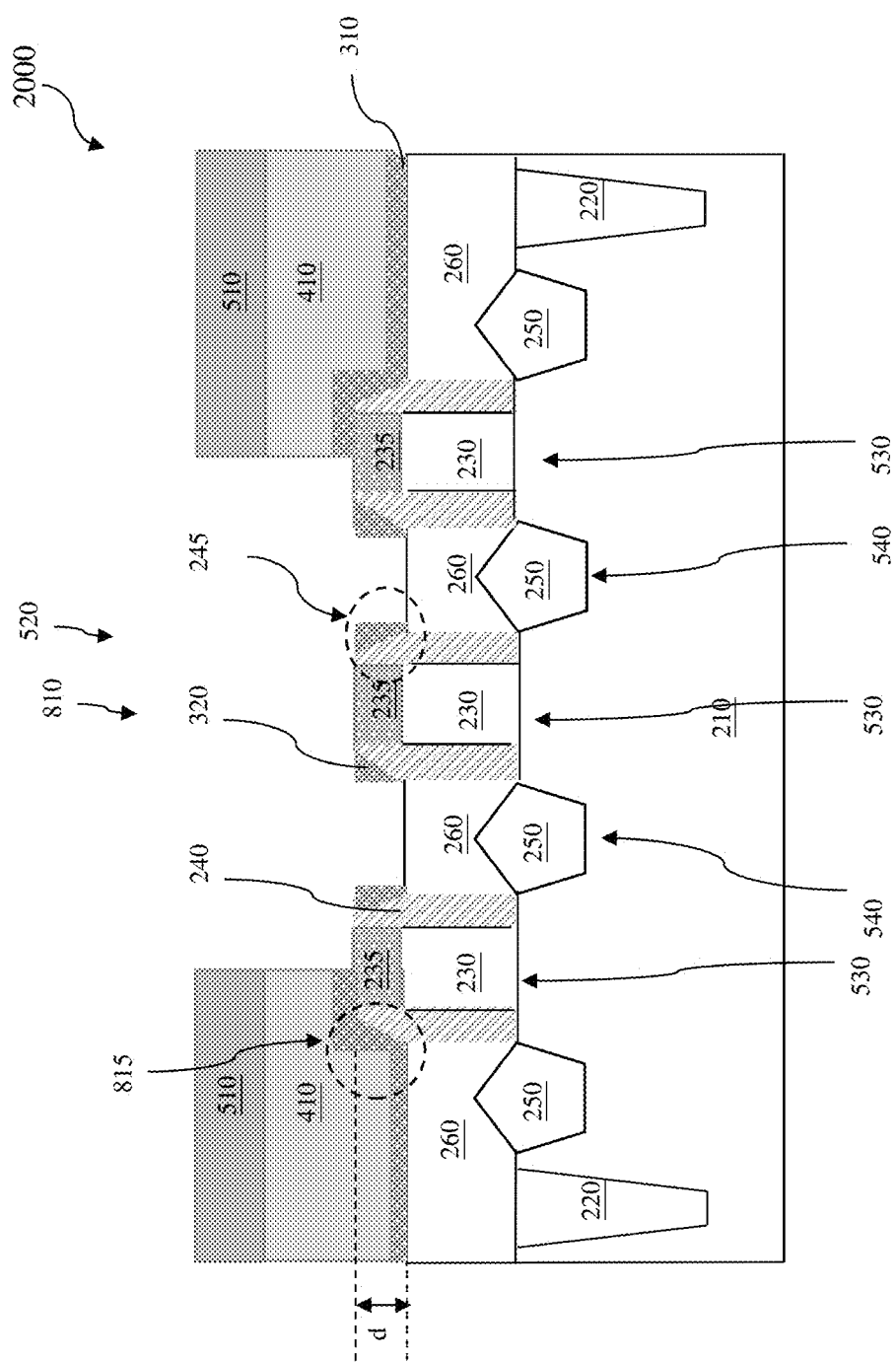

Referring to FIGS. 10 and 14, the method 1000 proceeds to step 1014 by applying a second etching process to forming the second spacers 320 and extend S/D sharing contact trench 810. The second spacer layer 310 is etched similarly in many respects to formation of second spacer 320 discussed above in association with FIG. 5. The second spacer layer 310 outside of the sharing S/D contact trench 810 remains intact as it is covered by the patterned second HM layer 510.

In one embodiment, one side of the HK/MG 230 is inside the sharing S/D contact trench 810 and another opposite side is outside of the sharing S/D contact trench 810. Therefore the second spacer 320 is formed over the thinner shoulder 245 of the side of the sidewall spacer 240 inside the sharing S/D contact trench 810, while the second spacer layer 310 remains intact on the side that is outside of the sharing S/D contact trench 810.

Figure 15:
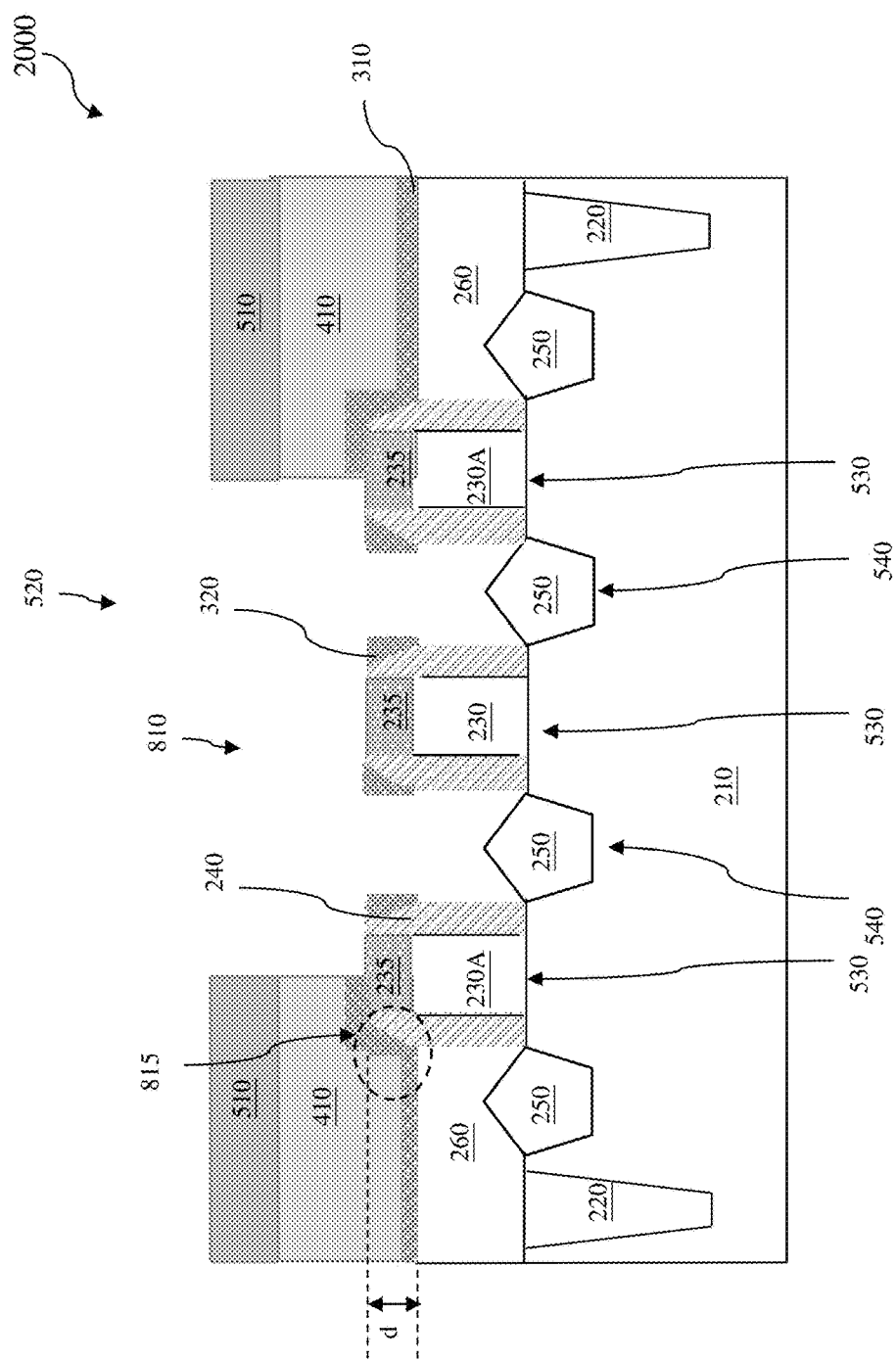

Referring to FIGS. 10 and 15 the method 1000 proceeds to step 1016 by applying a third etching process to etching the first dielectric layer 260 through the first sharing S/D contact trench 810 to extend it down to the subset 540 of the S/D features 250 thereby further extending sharing S/D contact trench 810. As has been mentioned previously, the third etch process is properly chosen to selectively remove the first dielectric layer 260, but substantially does not etch the first hard mask 235, the second spacer 320 and the sidewall spacer 240. The selective etch may include a selective wet etch, a selective dry etch, and/or a combination thereof. As discussed above, the second spacer 320 serves as an etch stopper and enhances protection for the subset 530 of the HK/MG 230 during the etch process. The patterned second HM layer 510 is removed by an etching process thereafter.

Figure 16:
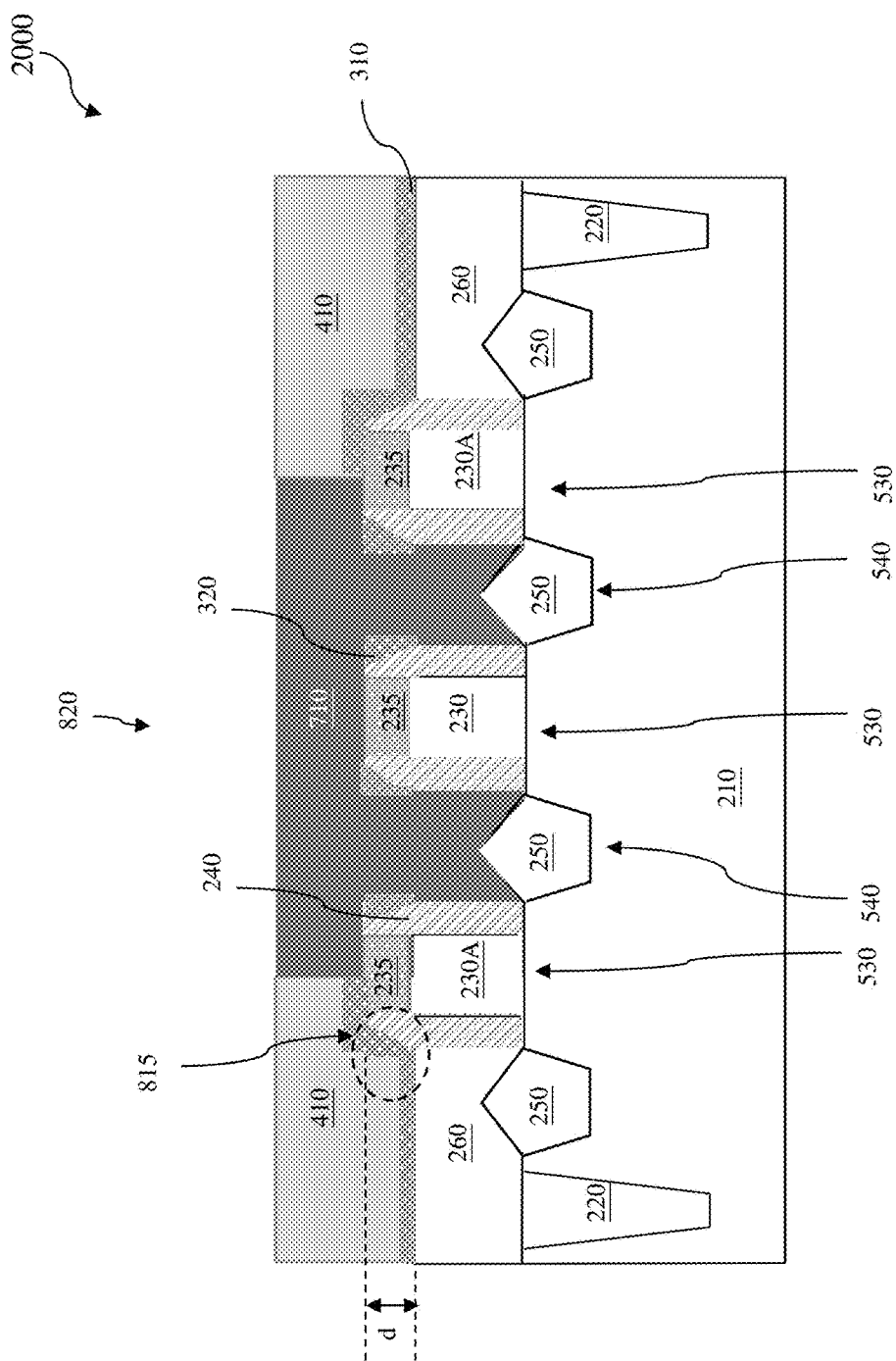

Referring to FIGS. 10 and 16 the method 1000 proceeds to step 1018 by depositing the contact metal layer 710 in sharing S/D contact trench 810 to form contact features extending down to the subset 540 of the S/D features 250. In the present embodiment, the subset 530 of the HK/MGs 230 are isolated from the contact metal layer 710 by being surrounded by the first hard mask 235, the second spacer 320 and the sidewall spacer 240. A CMP process is applied to etch back excessive contact metal layer 710.

Additional steps can be provided before, during, and after the method 1000, and some of the steps described can be replaced, eliminated, or moved around for additional embodiments of the method 1000.

The semiconductor devices, 200 and 2000, may include additional features, which may be formed by subsequent processing. For example, various vias/lines and multilayers interconnect features (e.g., metal layers and interlayer dielectrics) are formed over the substrate 210. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Based on the above, it can be seen that the present disclosure provide methods employing of forming second spacers along the outer edge of the sidewall spacers to protect the HK/MG during sharing S/D contact formation, when the HK/MGs are exposed to the contact etching process. The method demonstrates preventing MG corner loss during S/D contact formation to prevent MG electronic short. The method provides a robust S/D contact formation process with relaxed process constrains.

The present disclosure provides many different embodiments of fabricating a semiconductor device that provide one or more improvements over existing approaches. In one embodiment, a method for fabricating a semiconductor device includes forming a gate structure over a substrate. The gate structure includes a first hard mask layer. The method also includes forming a source/drain (S/D) feature in the substrate adjacent the gate structure, forming a sidewall spacer along sidewalls of the gate structure. The sidewall spacer has an outer edge at its upper portion facing away from the gate structure. The method also includes forming a first dielectric layer over the gate structure, forming a second spacer along sidewalls of the gate structure and along the outer edge of the sidewall spacer, forming a second dielectric layer over the gate structure, forming a trench extending through the first and second dielectric layers to expose a subset of the source/drain feature while the gate structure is protected by the first hard mask layer and the sidewall spacer with the second spacer. The method also includes forming a contact feature in the trench.

In yet another embodiment, a method includes providing an initial structure. The initial structure includes forming a gate structure over a substrate. The gate structure includes a first hard mask layer. The method also includes forming a source/drain (S/D) feature in the substrate adjacent the gate structure, forming a sidewall spacer along sidewalls of the gate structure. The sidewall spacer has an outer edge at its upper portion facing away from the gate structure. The method also includes forming a first dielectric layer over the gate structure, depositing a second spacer layer over the first dielectric layer and the gate structure, depositing a second dielectric layer over the second spacer layer, forming a sharing S/D contact in the second dielectric layer. A portion of the second spacer layer is exposed in the sharing S/D contact. The method also includes forming a second spacer along the outer edge of the sidewall spacer within the sharing S/D contact, extending the sharing S/D contact through the first dielectric layer to expose a subset of the S/D features, while each gate structure of a subset of the gate structure within the sharing S/D contact is protected by the first hard mask, the second spacer and the sidewall spacer. The method also includes forming a contact feature in the sharing S/D contact.

In yet another embodiment, a semiconductor device includes a first high-k/metal gate (HK/MG) with first sidewall spacers over a substrate. The sidewall spacer has an outer edge at its upper portion facing away from the gate structure. The device also includes a metal layer disposed over the first side of the first HK/MG, a second spacer along the outer edge of the sidewall spacer of the first side of the first HK/MG and a dielectric layer disposed over a second side of the first HK/MG. An upper portion of the first HK/MG is above the dielectric layer. The device also includes a spacer layer, which has same material as the second spacer, extending from the outer edge of sidewall spacer of the second side of the first HK/MG to the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming first spacers along sidewalls of a gate structure disposed over a substrate, wherein the gate structure is disposed between a first source/drain feature and a second source/drain feature, and further wherein the first spacers have upper portions having a tapered width;
    forming a first dielectric layer over the substrate, wherein the first dielectric layer is disposed over a portion of the first spacers;
    forming a spacer layer over the first dielectric layer and the gate structure, such that the spacer layer is disposed along the upper portions of the first spacers;
    forming a second dielectric layer over the spacer layer;
    removing a portion of the second dielectric layer to form a contact trench, wherein the contact trench exposes a portion of the spacer layer;
    removing a portion of the exposed portion of the spacer layer to extend the contact trench, thereby forming second spacers along the upper portions of the first spacers and exposing a portion of the first dielectric layer;
    removing the exposed portion of the first dielectric layer to extend the contact trench, thereby exposing the first source/drain feature and the second source/drain feature; and
    forming a contact feature in the contact trench.

2. The method of claim 1, wherein the forming the contact trench includes:
    forming a patterned hard mask layer over the second dielectric layer, wherein the patterned hard mask layer has an opening that exposes the portion of the second dielectric layer; and
    selectively etching the second dielectric layer through the opening.

3. The method of claim 1, wherein the first spacers and the second spacers include a material different than the first dielectric layer and the second dielectric layer.

4. The method of claim 1, wherein the forming the second spacers along the upper portions of the first spacers includes anisotropically etching the exposed portion of the spacer layer within the contact trench.

5. The method of claim 1, further comprising, before forming the spacer layer, recessing the first dielectric layer to expose the upper portions of the first spacers having the tapered width.

6. The method of claim 5, wherein the recessing the first dielectric layer includes selectively etching the first dielectric layer without removing the first spacers.

7. The method of claim 1, wherein the removing the exposed portion of the first dielectric layer to extend the contact trench includes selectively etching the first dielectric layer without removing the first spacers and the second spacers.

8. The method of claim 1, wherein the forming the contact feature includes:
    filling the contact trench with a contact metal layer, wherein the contact metal layer is disposed on the first source/drain feature and the second source/drain feature; and
    removing excessive contact metal layer.

9. The method of claim 1, wherein the contact feature extends over the gate structure and is electrically coupled with the first source/drain feature and the second source/drain feature.

10. A method comprising:
    forming first spacers along sidewalls of a gate structure disposed over a substrate, wherein the gate structure is disposed between a first source/drain feature and a second source/drain feature;
    forming a first dielectric layer over the substrate, wherein the first dielectric layer is disposed over the first spacers;
    recessing the first dielectric layer to expose upper portions of the first spacers, wherein the upper portions have a tapered width;
    forming a spacer layer over the first dielectric layer, such that the spacer layer is disposed along the upper portions of the first spacers;
    forming a second dielectric layer over the spacer layer;
    forming a patterned masking layer over the second dielectric layer;
    patterning the second dielectric layer, the spacer layer, and the first dielectric layer using the patterned masking layer to form a trench that exposes the gate structure, the first source/drain feature, and the second source/drain feature, wherein the patterning includes:
        etching an exposed portion of the second dielectric layer,
        etching an exposed portion of the spacer layer, thereby forming second spacers disposed along upper portions of the first spacers, and
        etching an exposed portion of the first dielectric layer; and
    filling the trench with a conductive material, thereby forming a shared source/drain contact to the first source/drain feature and the second source/drain feature.

11. The method of claim 10, wherein the shared source/drain contact spans uninterrupted between the first source/drain feature and the second source/drain feature over the gate structure.

12. The method of claim 10, wherein the spacer layer serves as an etch stop during the etching of the exposed portion of the second dielectric layer.

13. The method of claim 10, further comprising removing the patterned masking layer before filling the trench.

14. The method of claim 10, wherein the recessing the first dielectric layer to expose the upper portions of the first spacers includes selectively etching the first dielectric layer relative to the first spacers.

15. The method of claim 10, wherein the etching the exposed portion of the spacer layer includes performing an anisotropic etching process.

16. The method of claim 10, wherein the etching the exposed portion of the second dielectric layer includes performing a selective etching process.

17. The method of claim 10, wherein the etching the exposed portion of the first dielectric layer includes performing a selective etching process.

18. A semiconductor device comprising:
   a high-k/metal gate stack disposed over a substrate, wherein the high-k/metal gate stack is disposed between a first source/drain feature and a second source/drain feature;
   a first spacer set disposed along sidewalls of the high-k/metal gate stack;
   a first interlevel dielectric (ILD) layer disposed over the substrate, wherein upper portions of the first spacer set having a tapered width extend above the ILD layer;
   a second spacer set disposed over the first ILD layer, such that the second spacer set is disposed on the upper portions of the first spacer set;
   a second ILD layer disposed over the first ILD layer; and
   a contact feature extending through the second ILD layer, such that the contact feature is coupled with the first source/drain feature and the second source/drain feature, wherein the contact feature spans uninterrupted between the first source/drain feature and the second source/drain feature over the high-k/metal gate stack.

19. The semiconductor device of claim 18, wherein the high-k/metal gate stack includes:
   a high-k dielectric layer,
   a metal gate layer disposed over the high-k dielectric layer, and
   a hard mask layer disposed over the metal gate layer, wherein the contact feature is disposed on the hard mask layer.

20. The semiconductor device of claim 18, wherein the contact feature is disposed on the first spacer set and the second spacer set.

* * * * *